(12) United States Patent
Mao et al.

(10) Patent No.: US 10,251,294 B2
(45) Date of Patent: Apr. 2, 2019

(54) POWER SUPPLY STRUCTURE

(71) Applicant: FUJITSU LIMITED, Kawasaki-shi, Kanagawa (JP)

(72) Inventors: Xuelong Mao, Kawasaki (JP); Kayoko Kawano, Kawasaki (JP); Hajime Murakami, Kawasaki (JP); Hirofumi Mori, Yokohama (JP); Katsuhiko Tagishi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 77 days.

(21) Appl. No.: 15/487,513

(22) Filed: Apr. 14, 2017

(65) Prior Publication Data
US 2017/0311471 A1  Oct. 26, 2017

(30) Foreign Application Priority Data
Apr. 25, 2016 (JP) ................. 2016-087264

(51) Int. Cl.
| H05K 7/06 | (2006.01) |
| H02M 3/04 | (2006.01) |
| H05K 7/20 | (2006.01) |
| H05K 7/14 | (2006.01) |

(52) U.S. Cl.
CPC .......... *H05K 7/06* (2013.01); *H02M 3/04* (2013.01); *H05K 7/1432* (2013.01); *H05K 7/2039* (2013.01)

(58) Field of Classification Search
CPC .......... H01L 23/13; H01L 23/49805; H05K 1/141–1/144; H05K 1/181
USPC .......... 361/760–764, 767–770, 790
See application file for complete search history.

(56) References Cited

U.S. PATENT DOCUMENTS

| 5,588,848 A * | 12/1996 | Law .............. H01R 12/57 439/83 |
| 5,969,952 A * | 10/1999 | Hayashi ........... H05K 3/3426 257/696 |
| 6,493,240 B2 * | 12/2002 | Broglia ............ H05K 1/141 361/736 |
| 6,618,267 B1 * | 9/2003 | Dalal ............ H01L 23/5385 257/E23.114 |
| 7,246,434 B1 * | 7/2007 | Taylor ........... H05K 3/3442 29/830 |

(Continued)

FOREIGN PATENT DOCUMENTS

| JP | 63-152196 | 6/1988 |
| JP | 2000-59000 | 2/2000 |
| JP | 2001-156221 | 6/2001 |

*Primary Examiner* — Tuan T Dinh
(74) *Attorney, Agent, or Firm* — Fujitsu Patent Center

(57) ABSTRACT

A load board includes an electronic component and first wiring connected thereto. A power supply board includes a DC/DC converter and second wiring connected thereto. A bus block includes prismatic block-shaped conductors arranged with a gap interposed therebetween and fixed. The bus block is held between the first plate member and the second plate member such that the end faces of the block-shaped conductors are in contact with the load board and the power supply board. The bus block is connected to the first wiring and the second wiring such that current flows in a direction from the power supply board to the load board in one of two adjacent block-shaped conductors and that current flows in a direction from the load board to the power supply board in the other block-shaped conductor.

4 Claims, 8 Drawing Sheets

(56) References Cited

U.S. PATENT DOCUMENTS

| | | | | |
|---|---|---|---|---|
| 7,733,668 B2* | 6/2010 | Mizuhara | ............ | H01L 23/49805 |
| | | | | 361/770 |
| 7,845,954 B2* | 12/2010 | Tomura | .................. | H05K 1/144 |
| | | | | 439/66 |
| 8,270,174 B2* | 9/2012 | Wimmer | ................. | G06F 21/86 |
| | | | | 361/736 |
| 8,289,728 B2* | 10/2012 | Koide | ..................... | H01L 23/13 |
| | | | | 361/790 |
| 8,634,201 B1* | 1/2014 | Cabauy | ................. | H05K 1/181 |
| | | | | 361/763 |
| 2001/0054758 A1* | 12/2001 | Isaak | ................... | H01L 25/0657 |
| | | | | 257/686 |
| 2016/0172291 A1* | 6/2016 | Kim | ..................... | H01L 21/486 |
| | | | | 257/738 |

* cited by examiner

POWER SUPPLY STRUCTURE

CROSS-REFERENCE TO RELATED APPLICATION

This application is based upon and claims the benefit of priority of the prior Japanese Patent Application No. 2016-087264, filed on Apr. 25, 2016, the entire contents of which are incorporated herein by reference.

FIELD

The embodiments discussed herein are related to a power supply structure.

BACKGROUND

Conventionally, power supply to the central processing unit (CPU) and memory inside a server apparatus is implemented by supplying electric power generated from a power supply generation circuit in the same printed circuit board to electronic components including the CPU and memory using copper foil on the printed circuit board.

However, with demands for higher speed of CPUs and higher density, increase in current consumption and increase in power supply types are in demand. With the increase in power supply types, the number of power supply generation circuits is steadily increasing. Now that many power supply generation circuits are installed, installing power supply generation circuits and other electronic components on the same printed circuit board has reached a limit.

There is a power supply scheme that divides a board into a load board including electronic components serving as loads and a power supply board including power supply generation circuits for power supply and couples the load board and the power supply board to each other by bus bars.

Specifically, a bus bar for power feeding is brought into contact and fixed with a screw to a pad for supplying electric power generated by a direct current (DC)/DC converter disposed on the power supply board, and a bus bar for GND is brought into contact and fixed with a screw to a pad connecting to the ground (hereinafter abbreviated as GND). The bus bar for power feeding and the bus bar for GND are reinforced by fittings for preventing displacement and fixed to each other. The bus bar for power feeding and the bus bar for GND are brought into contact with the pads disposed on the load board and fixed with screws. Two clamps fixed to bus bars connecting to loads are inserted into the bus bar for power feeding and the bus bar for GND. The structure that couples the load board and the power supply board to each other with bus bars is thus completed. In this case, current flows from the bus bar for power feeding to the bus bar connecting to loads via the clamp to supply power to the load board. Current output from the loads then flows from the bus bar connecting to the loads to the bus bar for GND via the clamp and flows to the GND.

There is a conventional technique for supplying power from the power supply board to the load board, in which power is supplied through a power supply block disposed between a printed circuit board populated with semiconductor devices and a power supply bar extending from the back surface of the printed circuit board.

There is another conventional technique for keeping the space between boards by inserting a metal spacer between printed circuit boards and fixing the spacer with screws. In yet another conventional technique, a block with low-melting metal surrounded with an insulator is inserted between a semiconductor board and a mount board, and the boards are joined to each other by melting the low-melting metal. Conventional examples are described in Japanese Laid-open Patent Publication No. 63-152196, Japanese Laid-open Patent Publication No. 2001-156221, and Japanese Laid-open Patent Publication No. 2000-59000.

Unfortunately, when the power supply board is connected with the power feed board by bus bars, disposing the bus bars at the ends of the boards and fixing the C-shaped bus bars with screws increase the length of the power feed path and increase the resistance value of the power feeding conductor. It is therefore difficult to conduct appropriate power feeding due to a voltage drop and heat generation when large current is supplied.

Moreover, since the power feed path is long and the distance between the bus bar for power feeding and the bus bar for GND is wide, a large inductance component is produced on the power feed path. When the resistance and the inductance are large, the impedance of the power feed path is high. The amount of fluctuation of voltage supplied to the load increases in proportion to the amount of fluctuation of current and the impedance. Since the voltage fluctuation causes power supply noise, the greater impedance increases the noise at the load end. While the operating voltage of electronic components is decreasing year by year, the effect of power supply noise on the operation of electronic components is a serious problem, and reducing power supply noise is desired. A possible method for suppressing voltage fluctuation is to mount a large amount of capacitors. This method, however, increases the number of components and makes it difficult to reduce space and costs.

SUMMARY

According to an aspect of an embodiment, a power supply structure includes: a first plate member that includes a load, and has first wiring connected to the load; a second plate member that includes a power supply unit that supplies electric power to the load and has second wiring connected to the power supply unit; and a block member that has includes prism-shaped conductive members arranged with a gap interposed therebetween and fixed, is held between the first plate member and the second plate member such that end faces of the conductive members are in contact with the first plate member and the second plate member, is connected to each of the first wiring and the second wiring such that current flows in a direction from the second plate member to the first plate member in one of two adjacent conductive members of the conductive members and that current flows in a direction from the first plate member to the second plate member in the other of the two adjacent conductive members.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings. It is noted that the power supply structure disclosed in the present application is not limited by the following embodiments.

Figure 1:
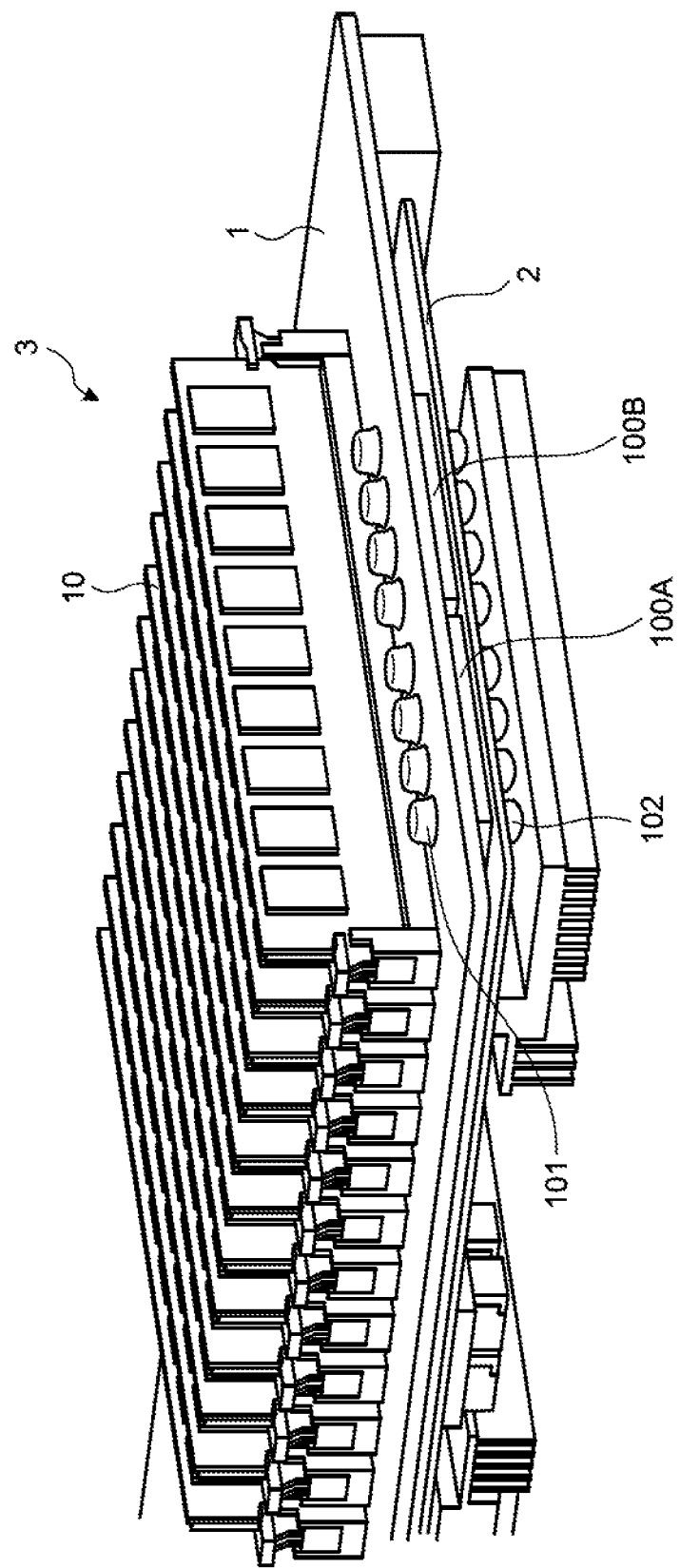
FIG. 1 is a perspective view of a power supply structure according to an embodiment.

FIG. 1 is a perspective view of the power supply structure according to an embodiment. A power supply structure 3 includes a load board 1, a power supply board 2, and bus blocks 100A and 100B.

The load board 1 is populated with electronic components 10 such as memory and the CPU, which are an example of the load. FIG. 1 illustrates dual data rate (DDR) memory as an example of the electronic component 10. The load board 1 is, for example, a motherboard.

The power supply board 2 contains a power supply unit such as a not-illustrated DC/DC converter. The power supply board 2 may additionally contain a heat sink and other components. The power supply unit outputs low-voltage and large-current power. The low voltage is, for example, 1.2 V. The large current is, for example, 120 A.

The bus blocks 100A and 100B are held between the load board 1 and the power supply board 2. The bus blocks 100A and 100B are fixed to the load board 1 with screws 101. The bus blocks 100A and 100B are fixed to the power supply board 2 with screws 102. The bus blocks 100A and 100B are hereinafter simply referred to as "bus block 100" unless otherwise specified.

The bus block 100 provides a conducting path for GND for sending current supplied from the power supply unit mounted on the power supply board 2 to the electronic components 10 on the load board 1 and passing current from the electronic components 10 to GND. Although FIG. 1 illustrates two bus blocks 100 called bus blocks 100A and 100B, the number of bus blocks 100 is preferably determined in accordance with the magnitude of supply current and the number of power source types. For example, when supply current is large, it is preferable that more bus blocks 100 are disposed. When there are a number of power source types, it is preferable that more bus blocks 100 are disposed.

Figure 2:
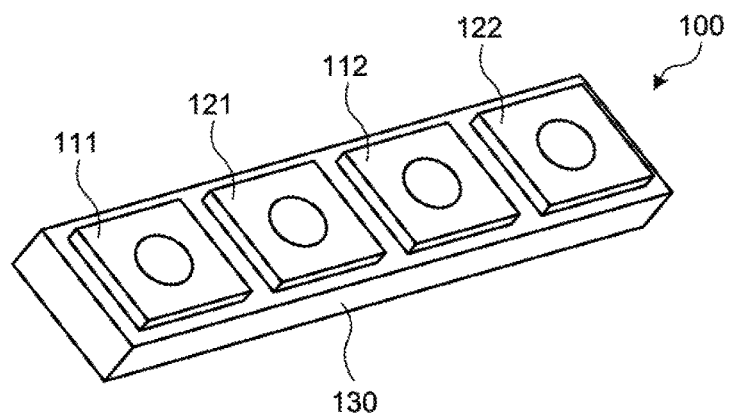
FIG. 2 is a perspective view of a bus block according to an embodiment.

FIG. 2 is a perspective view of the bus block according to an embodiment. The bus block 100 includes block-shaped conductors 111 to 122. The block-shaped conductors 111 to 122 are conductors having a quadratic prism shape formed of copper. All the block-shaped conductors 111 to 122 have the same structure.

In the present embodiment, the block-shaped conductors 111 to 122 are arranged in a row. In the bus block 100, the block-shaped conductors 111 to 122 are put together so as to be each surrounded by an insulator 130 on the periphery. That is, the bus block 100 has a gap between each of the block-shaped conductors 111 to 122, and the insulator 130 is disposed in the gap such that the block-shaped conductors 111 to 122 are not in contact with each other.

Figure 3:
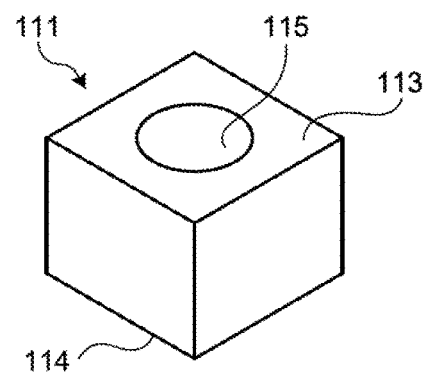
FIG. 3 is a perspective view of a quadratic prism block-shaped conductor.

FIG. 3 is a perspective view of the block-shaped conductor. Since all the block-shaped conductors 111 to 122 have the same structure, the structure of the block-shaped conductor 111 will be described here, by way of example. FIG. 3 illustrates the block-shaped conductor 111 removed from the bus block 100. The block-shaped conductor 111 has a quadratic prism shape, as illustrated in FIG. 3. The block-shaped conductor 111 has two faces 113 and 114 in contact with the load board 1 and the power supply board 2. These faces 113 and 114 are an example of "one end face" and "the other end face".

A screw hole 115 extends from the face 113 in the direction toward the face 114. Although not illustrated in FIG. 3, a screw hole extends similarly from the face 114 in the direction toward the face 113. The screw hole in the face 114 may be connected with the screw hole 115 or may be separate from the screw hole 115. In the present embodiment, the screw hole in the face 114 is connected with the screw hole 115, by way of illustration. That is, the screw hole 115 is present in both faces 113 and 114.

Here, the block-shaped conductor 111 is shaped in a quadratic prism so that the adjacent face that is a surface facing the adjacent block-shaped conductor 121 is quadrangular. This shape increases the area facing the block-shaped conductor 121.

Figure 4:
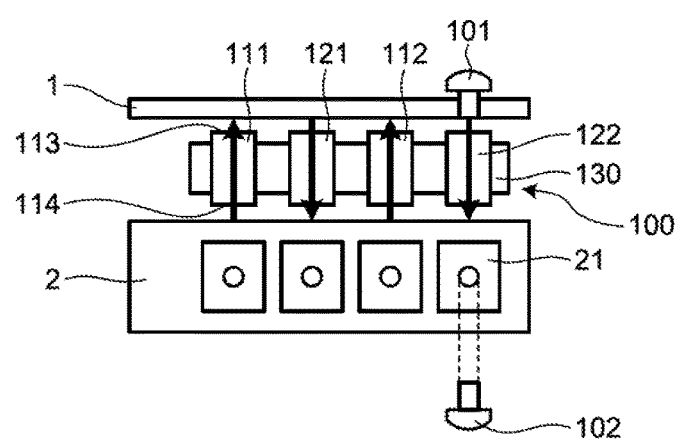
FIG. 4 is a diagram for explaining a connection state of the block-shaped conductors.

FIG. 4 is a diagram for explaining a connection state of the block-shaped conductors. As illustrated in FIG. 4, the block-shaped conductors 111 to 122 are sandwiched between the load board 1 and the power supply board 2. The block-shaped conductors 111 to 122 each have one end face in contact with the load board 1 and the other end face in contact with the power supply board 2. The power supply board 2 in FIG. 4 is depicted so as to expose the surface on the side in contact with the screw 102, for convenience of explanation.

In the state in which the bus block 100 is sandwiched between the power supply board 2 and the load board 1, power supply pads 21 connecting to the wiring (wiring pattern) between the power supply board 2 and the load board 1 are disposed on the surface of the power supply board 2 on the side in contact with the block-shaped conductors 111 to 122. This power supply pad 21 is an example of "electrode".

The power supply pad 21 disposed on the power supply board 2 is a member for ensuring connection between the block-shaped conductors 111 to 122 and the wiring laid on the power supply board 2. The power supply pads 21 disposed on the power supply board 2 are in contact with the respective faces 114 of the block-shaped conductors 111 to 122. The power supply pads 21 in contact with the block-shaped conductors 111 and 112 connect to the power supply. The power supply pads 21 in contact with the block-shaped conductors 121 and 122 connect to GND. The wiring on the power supply board 2 for connecting the power supply and the ground to the power supply pad 21 is an example of the "second wiring".

In a state in which the bus block 100 is sandwiched between the power supply board 2 and the load board 1, power supply pads connecting to the wiring (wiring pattern) between the power supply board 2 and the load board 1 are arranged also on the surface of the load board 1 on the side in contact with the block-shaped conductors 111 to 122, in the same manner as in the power supply board 2. The power supply pads on the load board 1 are in contact with the respective faces 113 of the block-shaped conductors 111 to 122. The power supply pads on the load board 1 in contact with the block-shaped conductor 111 and 112 connect to the power supply terminals of the electronic components mounted on the load board 1. The power supply terminals include an "input terminal", which is a terminal for supplying electricity to the electronic component, and an "output terminal", which is a terminal outputting electricity from the electronic component. The power supply pads on the load board 1 in contact with the block-shaped conductors 121 and 122 are connected to the GND terminals of the electronic components mounted on the load board 1. The wiring on the load board 1 for connecting the electronic component with the power supply pad is an example of "first wiring".

That is, the block-shaped conductors 111 and 112 are power supply components for the electronic components on the load board 1, and the block-shaped conductors 121 and 122 serve as GND paths connecting to GND for the electronic components on the load board 1. In the following, for easy understanding of the respective roles of the block-shaped conductors 111 to 122, the block-shaped conductors 111 and 112 serving as power supply components may be referred to as "power feed blocks 111 and 112". The block-shaped conductors 121 and 122 serving as GND paths may be referred to as "GND blocks 121 and 122".

The power feed blocks 111 and 112 and the GND blocks 121 and 122 are disposed between the load board 1 and the power supply board 2 so as to be alternately arranged. That is, in the bus block 100 according to the present embodiment, the power feed block 111 and the power feed block 112 as well as the GND block 121 and the GND block 122 are disposed so as not to be continuously arranged. Also between the bus block 100A and the bus block 100B, the power feed blocks 111 and 112 and the GND blocks 121 and 122 are disposed so as to be alternately arranged. That is, when the bus block 100A and the bus block 100B are disposed such that the block-shaped conductors 111 to 122 are arranged in a row, the GND block 122 of the bus block 100A is arranged adjacent to the power feed block 111 of the bus block 100B.

This arrangement state can be translated into a connection relation as described below. That is, the power feed blocks 111 and 112 connected such that current flows from the power supply board 2 to the load board 1 and the GND blocks connected such that current flows from the load board 1 to the power supply board 2 are alternately arranged.

The power feed blocks 111 and 112 as well as the GND blocks 121 and 122 have the screws 101 inserted from the respective screw holes 115 from the load board 1 to be fixed to the load board 1. The power feed blocks 111 and 112 as well as the GND blocks 121 and 122 have the screws 102 inserted in the respective screw holes 115 from the power supply board 2 and fixed to the power supply board 2.

Figure 5:
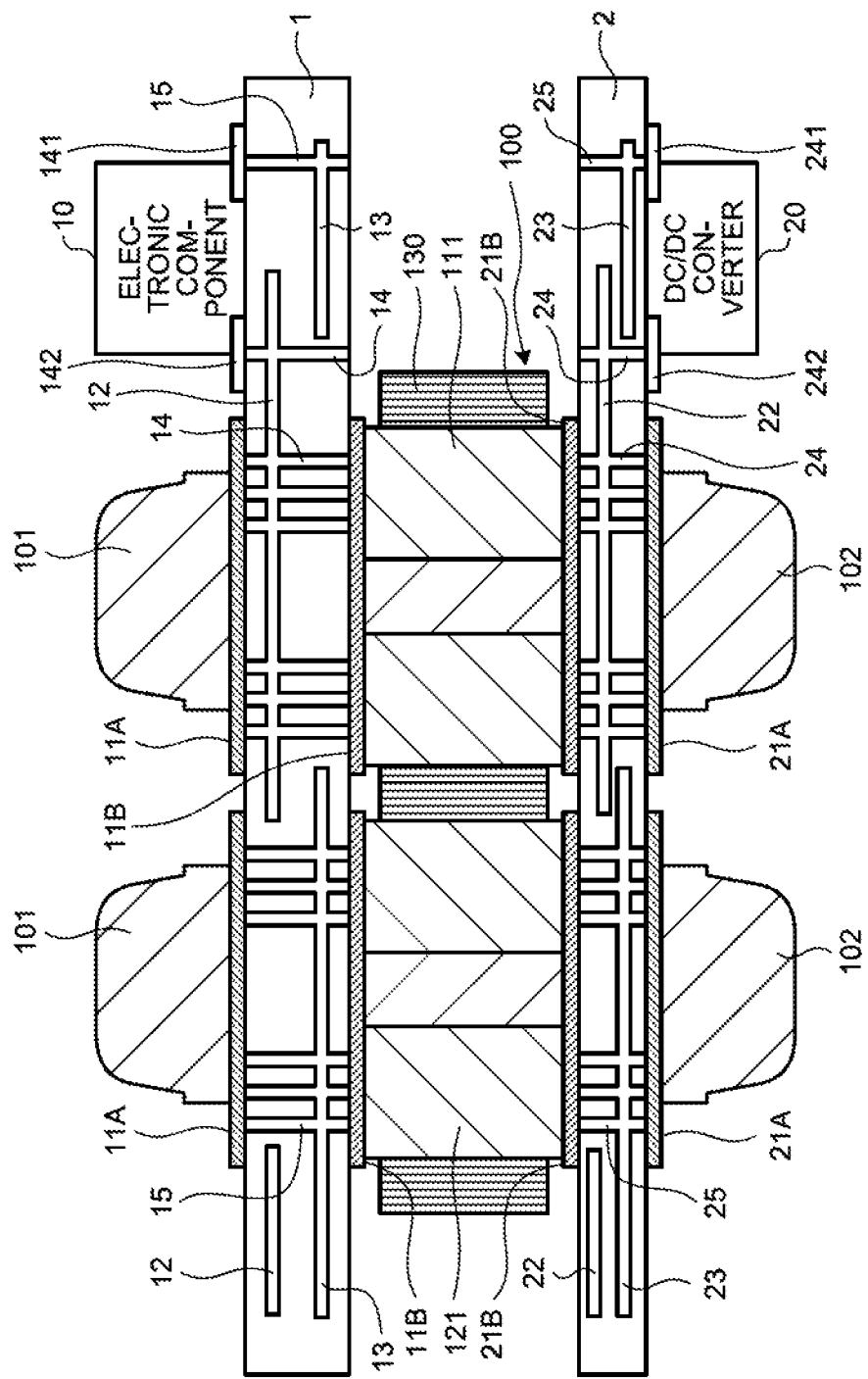
FIG. 5 is a schematic cross-sectional view for explaining a power supply path.

FIG. 5 is a schematic cross-sectional view for explaining the power supply path. FIG. 5 illustrates the power feed block 111 and the GND block 121 fixed to the load board 1 and the power supply board 2.

A power feed layer 12 and a GND layer 13 are disposed in the load board 1. In addition, the electronic component 10 is mounted on the load board 1. A power feed layer 22 and a GND layer 23 are disposed in the power supply board 2. In addition, a DC/DC converter 20 is mounted on the power supply board 2.

A power supply pad 11A is disposed between the screw 101 and the load board 1, and a power supply pad 11B is disposed between the load board 1 and the power feed block 111 and between the load board 1 and the GND block 121. A power supply pad 21A is disposed between the screw 102 and the power supply board 2, and a power supply pad 21B is disposed between the power supply board 2 and the power feed block 111 and between the power supply board 2 and the GND block 121. The power supply pads 11A, 11B, 12A, and 21B are formed of a corrosion-resistant and conductive material such as copper and gold plating.

The power supply pads 11B and 21B are disposed in order to increase the contact area of power supply vias 14 and 24 and GND vias 15 and 25 described later with the power feed block 111 and the GND block 121. If the GND vias 15 and 25 are directly in contact with the power feed block 111 and the GND block 121, the contact area is small and the contact resistance is high, possibly causing a voltage drop or heat generation at the contact point. By contrast, arranging the power pads 11B and 21B can increase the contact area and reduce the contact resistance.

The DC/DC converter 20 mounted on the power supply board 2 is connected to power supply pads 241 and 242. The power supply pad 241 is connected to the GND layer 23 through the GND via 25. The power supply pad 242 is connected to the power feed layer 22 through the power supply via 24. The power feed layer 22 is connected to the power feed block 111 through the power supply via 24 with the power supply pad 21B interposed therebetween. The GND layer 23 is connected to the GND block 121 through the GND via 25 with the power supply pad 21B interposed therebetween.

The electronic component 10 mounted on the load board 1 is connected to power supply pads 141 and 142. The power supply pad 141 is connected to the GND layer 13 through the GND via 15. The power supply pad 142 is connected to the power feed layer 12 through the power supply via 14. The power feed layer 12 is connected to the power feed block 111 through the power supply via 14 with the power supply pad 11B interposed therebetween. The GND layer 13 is connected to the GND block 121 through the GND via 15 with the power supply pad 11B interposed therebetween.

Electricity generated by the DC/DC converter 20 is fed to the electronic component through the power supply path. The power supply path is constructed with a power feed path from the DC/DC converter 20 to the electronic component 10 and a conducting path from the electronic component 10 to GND.

In the present embodiment, the power supply pad 242, the power supply via 24, the power feed layer 22, the power supply via 24, the power supply pad 21B, the power feed block 111, the power supply pad 11B, the power supply via 14 of the load board 1, and the power feed layer 12 are disposed on the power feed path. In the present embodiment, the power supply pad 141, the GND via 15, the GND layer 13, the GND via 15, the power supply pad 11B, the GND block 121, the power supply pad 21B, the GND via 25 of the power supply board 2, the GND layer 23, the GND via 25, the power supply pad 241, and the DC/DC converter 20 are disposed on the conducting path.

Current output from the DC/DC converter 20 then passes through the power supply pad 242 and the power supply via 24 and flows into the power feed layer 22. Current flowing to the power feed layer 22 passes through the power supply via 24 and the power supply pad 21B and flows into the power feed block 111. Current flowing to the power feed block 111 passes through the power supply pad 11B and the power supply via 14 of the load board 1 and flows into the power feed layer 12. Current flowing to the power feed layer 12 passes through the power supply via 14 and the power supply pad 142 and flows into the electronic component 10.

Subsequently, current output from the electronic component 10 passes through the power supply pad 141 and the GND via 15 and flows into the GND layer 13. Current flowing into the GND layer 13 passes through the GND via 14 and the power supply pad 11B and flows into the GND block 121. Current flowing into the GND block 121 passes through the power supply pad 21B and the GND via 25 of the power supply board 2 and flows into the GND layer 23. Current flowing into the GND layer 23 passes through the GND via 25 and the power supply pad 241 and flows into the DC/DC converter 20 and finally to GND.

In this way, power supply is supplied to the electronic components 10 via the power feed blocks 111 and 112 and is released to GND via the GND blocks 121 and 122. That is, low-voltage and large-current power supply output from the DC/DC converter 20 is supplied to the electronic components 10 using the power feed blocks 111 and 112 as well as the GND blocks 121 and 122.

Here, the direction in which current flows in the power feed blocks 111 and 112 is opposite from that in the GND blocks 121 and 122. The power feed blocks 111 and 112 and the GND blocks 121 and 122 through which current flows in opposite directions are arranged alternately to cancel out a magnetic field produced by current. This arrangement can reduce the inductance component produced by the power feed path, namely, the power feed blocks 111 and 112 as well as the GND blocks 121 and 122.

Here, the relation of the impedance of the power feed path with the resistance and the inductance of the power feed path is represented by Equation (1) below:

$$Z = R + j \cdot L \quad (1)$$

where Z is the impedance of the power feed path, R is the resistance of the power feed path, and L is the inductance of the power feed path. That is, the greater the resistance and the inductance of the power feed path are, the greater the impedance of the power feed path is.

The relation of the impedance of the power feed path with the amount of fluctuation of voltage and the amount of fluctuation of current supplied to the electronic component 10 is represented by Equation (2) below:

$$\Delta V = \Delta I \cdot Z \quad (2)$$

where $\Delta V$ is the amount of fluctuation of voltage supplied to the electronic component 10, and $\Delta I$ is the amount of fluctuation of current supplied to the electronic component 10. That is, the amount of voltage fluctuation increases in proportion to the amount of current fluctuation and the impedance of the power feed path. The voltage fluctuation causes power supply noise. In order to suppress power supply noise, it is preferable to suppress voltage fluctuation.

Based on this, suppressing the inductance of the power feed path can alleviate power supply noise. As in the present embodiment, the power feed blocks 111 and 112 and the GND blocks 121 and 122 through which current flows in opposite directions are arranged alternately to suppress the inductance of the power feed path and alleviate power supply noise.

The power feed blocks 111 and 112 as well as the GND blocks 121 and 122 have a quadratic prism shape. Because of this shape, the adjacent faces of the power feed blocks 111 and 112 as well as the GND blocks 121 and 122 are in such a state that quadrangular surfaces are opposed to each other.

Figure 6:
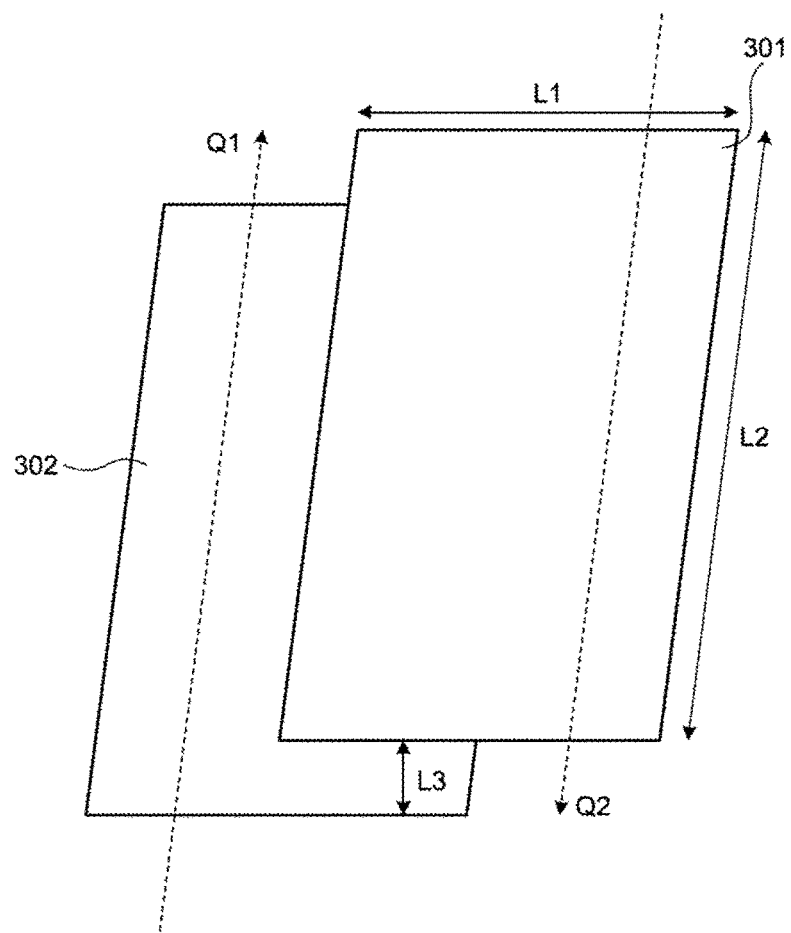
FIG. 6 is a diagram for explaining inductance in parallel flat plates.

The inductance of parallel flat plates 301 and 302 depicted in FIG. 6 will now be described. FIG. 6 is a diagram for explaining the inductance of parallel flat plates. The parallel flat plates 301 and 302 depict part of two flat plates opposed to each other with infinite extent. The parallel flat plates 301 and 302 depicted in FIG. 6 have a conductor width L1 and a conductor length L2. The distance between the parallel flat plates 301 and 302 is a distance L3. In the parallel flat plates 301 and 302, current flows in the opposite directions in the direction in which the conductor length L2 extends in FIG. 6. That is, current flows in the directions of arrows Q1 and Q2. In this case, the inductance of the parallel flat plates 301 and 302 is represented by Equation (3) below:

$$L = \mu \cdot L3 \cdot L2 / L1 \quad (3)$$

where $\mu$ is the permeability of the insulator 130, and L1, L2, and L3 are the lengths depicted in FIG. 6. As illustrated by Equation (3), the longer the conductor width L1 is, the smaller the inductance is, and the shorter the conductor length L2 is, the smaller the inductance is. The shorter the distance L3 is, the smaller the inductance L is.

Figure 7:
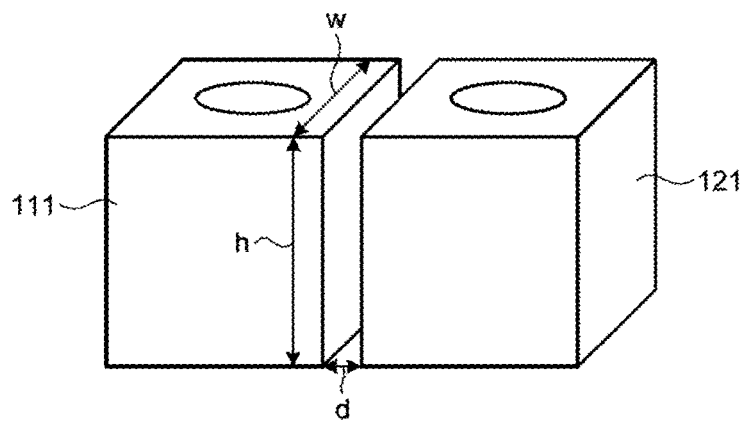
FIG. 7 is a diagram for explaining the effect of an adjacent surface shape on inductance.

Referring now to FIG. 7, the inductance of the quadratic prism-shaped power feed block 111 and GND block 121 will be described. FIG. 7 is a diagram for explaining the effect of the shape of the adjacent face on the inductance. As illustrated in FIG. 7, the distance d is, for example, the distance between the respective opposing faces of the power feed block 111 and the GND block 121. The height h is the length of the side in the direction in which electricity flows in the respective opposing faces of the power feed block 111 and the GND block 121 held between the load board 1 and the power supply board 2. The width w is the side orthogonal to the height h of the respective opposing faces of the power feed block 111 and the GND block 121.

We will now examine the minute surface closer to the center in the respective opposing faces of the power feed block 111 and the GND block 121 in FIG. 7. This minute surface can be considered as a state almost identical to the state of the parallel flat plates 301 and 302 in FIG. 6, and the inductance can be considered to approximate to the inductance in the parallel flat plates 301 and 302. That is, the width w can be considered as the conductor width L1, the height h can be considered as the conductor length L2, and the distance d can be considered as the distance L3. In this case, the inductance produced in the power feed block 111 and the GND block 121 can be approximated by Equation (3).

That is, the shorter the distance d is, the smaller the inductance L is. Here, in the bus block 100 according to the present embodiment, the insulator 130 is sandwiched between the power feed block 111 and the GND block 121 and can prevent short-circuiting due to displacement when the power feed block 111 and the GND block 121 are arranged close to each other. In the bus block 100 according to the present embodiment, therefore, the distance between the power feed block 111 and the GND block 121 can be reduced. This reduction in distance can reduce the inductance and alleviate power supply noise.

The shorter the height h is, the smaller the inductance is, and the longer the width w is, the smaller the inductance is. Here, it is preferable to minimize the length in the longitudinal direction in order to reduce the electricity transmission distance in the power feed block 111 and the GND block 121. It can be said that when the height h is determined to be the shortest distance, the inductance decreases as the area of the respective opposing faces of the power feed block 111 and the GND block 121 increases, that is, as the adjacent area of the power feed block 111 and the GND block 121 increases. Here, the power feed block 111 and the GND block 121 are shaped in a quadratic prism and have a larger adjacent area, compared with, for example, a cylinder. The power feed block 111 and the GND block 121 shaped in a quadratic prism therefore can suppress inductance and alleviate power supply noise.

Figure 8:
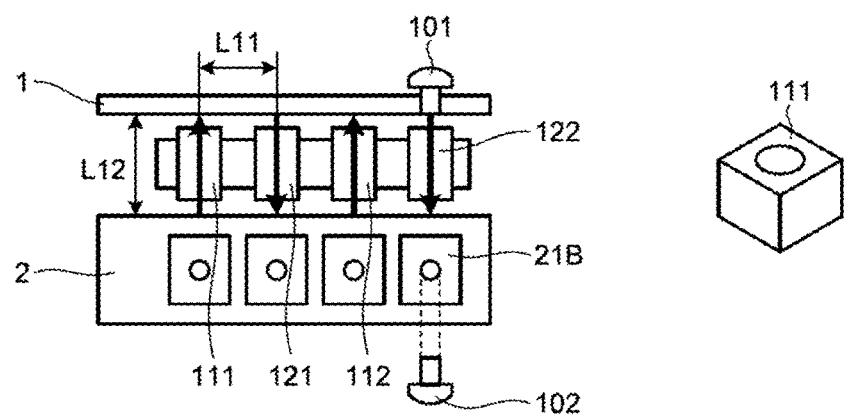
FIG. 8 is a diagram for explaining a configuration in which quadratic prism-shaped GND block and power feed block are alternately arranged.
Figure 9:
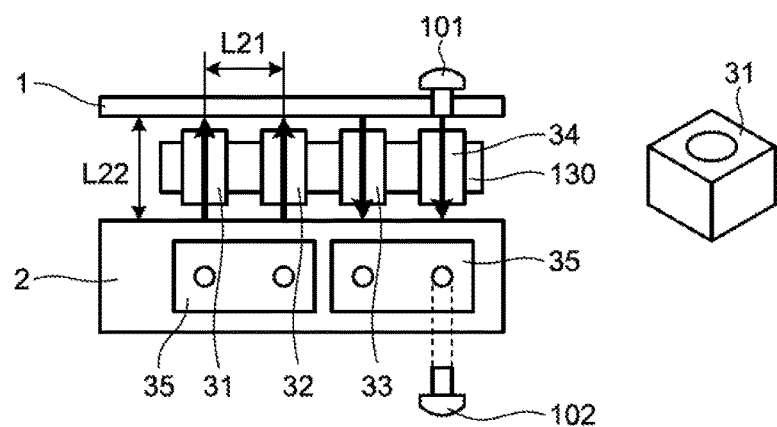
FIG. 9 is a diagram for explaining a configuration in which quadratic prism-shaped GND blocks are arranged side by side and quadratic prism-shaped power feed blocks are arranged side by side.
Figure 10:
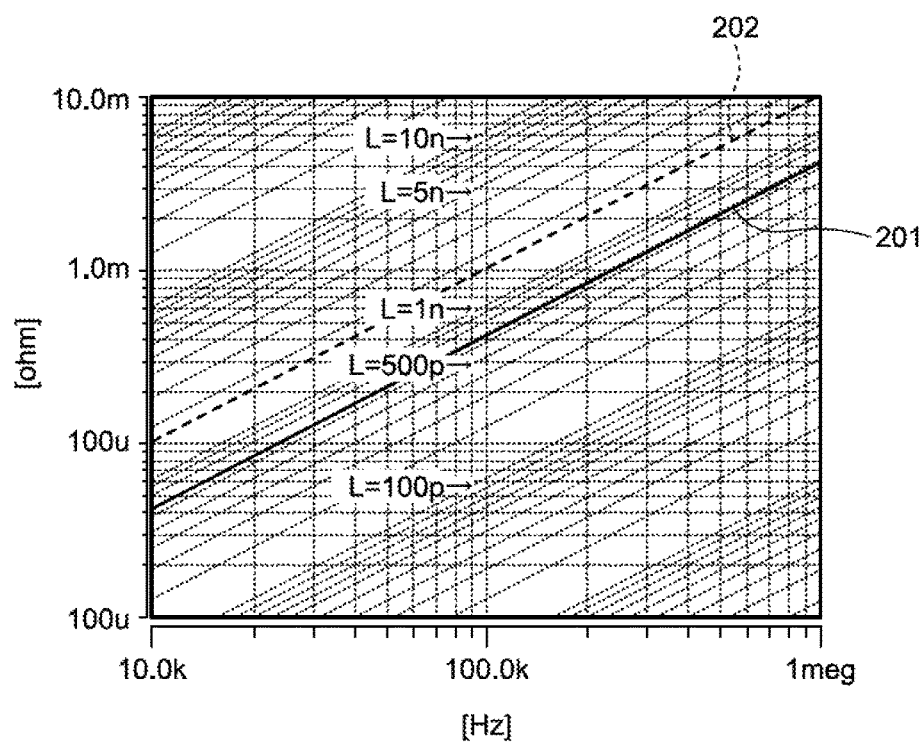
FIG. 10 is a diagram for explaining comparison of inductance between the side-by-side arrangement of quadratic prism-shaped GND blocks and power feed blocks and the alternate arrangement of GND blocks and power feed blocks.

Referring now to FIGS. 8 to 12, the inductance in the case where the power supply structure 3 according to the present embodiment is used will be described in comparison with the inductance in the case of another configuration. FIG. 8 is a diagram for explaining a configuration in which the quadratic prism-shaped GND block and power feed block are alternately arranged. FIG. 9 is a diagram for explaining the case where the quadratic prism-shaped GND blocks are arranged side by side and the quadratic prism-shaped power feed blocks are arranged side by side. FIG. 10 is a diagram for explaining the comparison of inductance between the side-by-side arrangement of the quadratic prism-shaped GND blocks and the quadratic prism-shaped power feed blocks and the alternate arrangement of the GND blocks and the power feed blocks. FIG. 10 illustrates the result of simulation using the configurations in FIG. 8 and FIG. 9.

Figure 11:
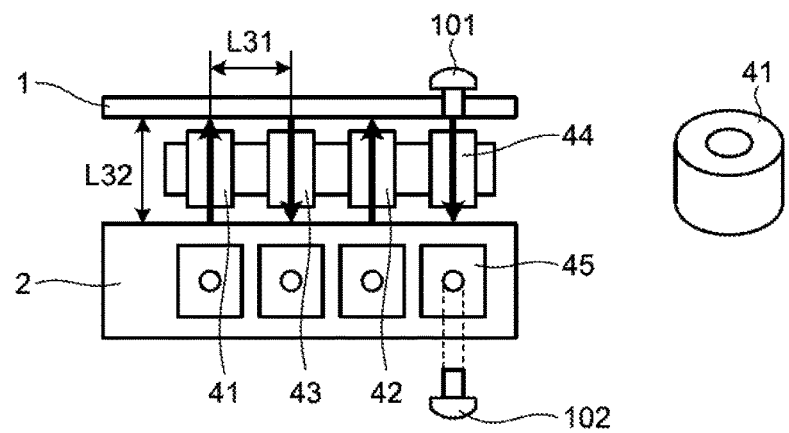
FIG. 11 is a diagram for explaining a configuration in which cylinder-shaped GND blocks and power feed blocks are alternately arranged.
Figure 12:
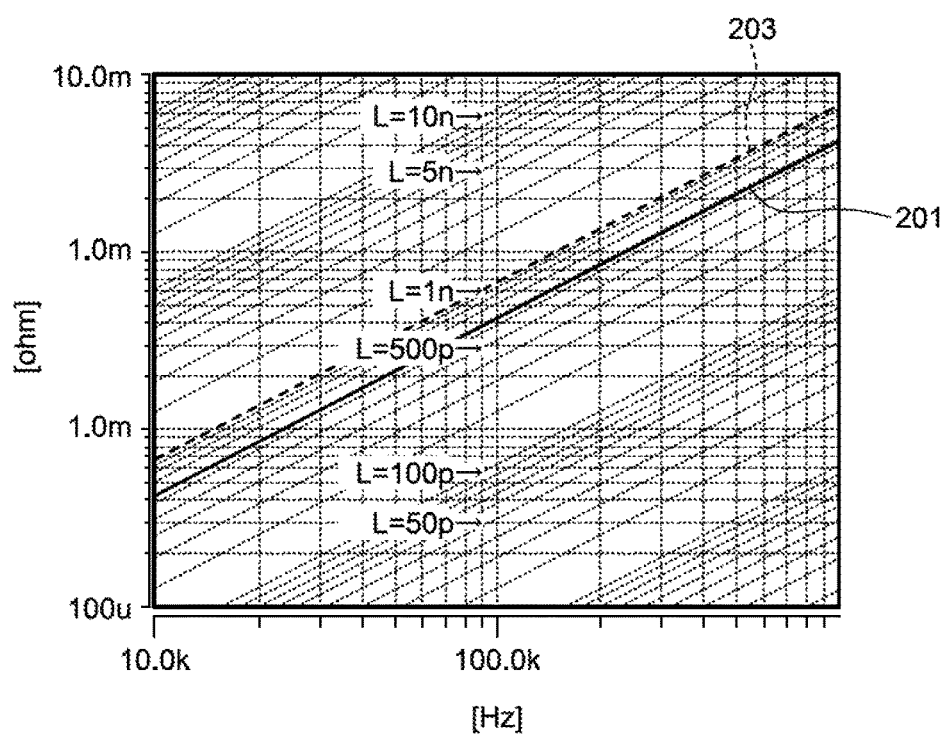
FIG. 12 is a diagram for explaining comparison of inductance between the use of quadratic prism-shaped blocks and the use of cylinder-shaped blocks.

FIG. 11 is a diagram for explaining the configuration in which the cylinder-shaped GND blocks and power feed blocks are alternately arranged. FIG. 12 is a diagram for explaining the comparison of inductance between the use of quadratic prism-shaped blocks and the use of cylinder-shaped blocks. FIG. 12 illustrates the result of simulation using the configurations in FIG. 8 and FIG. 11. In the example described here, the voltage is 1.2 V, and the current is 135 A. It is assumed that the temperature increase is 20° C. when power supply is conducted.

In FIG. 10, the vertical axis represents the magnitude of inductance. The horizontal axis represents frequency. The line 201 represents the inductance corresponding to the frequency in the case of the configuration in FIG. 8. The line 202 represents the inductance corresponding to the frequency in the case of the configuration in FIG. 9.

That is, when the inductance is as represented by the line 201, the configuration is as follows. As illustrated in FIG. 8, the power feed blocks 111 and 112 as well as the GND blocks 121 and 122 each have a quadratic prism shape with a height L12 of 7 mm and a conductor diameter of 8 mm. The power supply pad 21B of the power supply board 2 is disposed so as to correspond to each of the power feed blocks 111 and 112 as well as the GND blocks 121 and 122. The similar power supply pads are disposed also on the load board 1. The power feed blocks 111 and 112 and the GND blocks 121 and 122 are fixed to the load board 1 with the screws 101 and fixed to the power supply board 2 with the screws 102. The power feed blocks 111 and 112 as well as the GND blocks 121 and 122 have a distance L11 of 12 mm between the center axes, in the same manner. In other words, the power feed blocks 111 and 112 as well as the GND blocks 121 and 122 have a distance between conductors of 4 mm. FIG. 8 illustrates an example of the configuration described in the embodiment.

When the inductance is as illustrated by the line 202, the configuration is as follows. As illustrated in FIG. 9, a power feed block 31 has a quadratic prism shape with a height L22 of 7 mm and a conductor diameter of 8 mm. A power feed block 32 as well as GND blocks 33 and 34 each have a quadratic prism shape similar to the power feed block 31. The power feed block 31 and the power feed block 32 are disposed so as to be adjacent to each other. The GND block 33 and the GND block 34 are disposed so as to be adjacent to each other. A power supply pad 35 of the power supply board 2 is singly disposed so as to be in contact with both of the power feed blocks 31 and 32, and another power supply pad 35 is singly disposed so as to be in contact with both of the GND blocks 33 and 34. In this case, since the power feed paths are adjacent to each other and the GND paths are adjacent to each other, a single power supply pad 35 is provided for the adjacent paths. Similar power supply pads are disposed also on the load board 1. The power feed blocks 31 and 32 as well as the GND blocks 33 and 34 are then fixed to the load board 1 with the screws 101 and fixed to the power supply board 2 with the screws 102. The power feed blocks 31 and 32 as well as the GND blocks 33 and 34 are disposed such that the distance L21 between the center axes is 12 mm. In other words, the power feed blocks 111 and 112 as well as the GND blocks 121 and 122 have a distance between conductors of 4 mm. That is, the configuration in FIG. 8 and the configuration in FIG. 9 differ in that the power feed blocks 31 and 32 are adjacent and the GND blocks 33 and 34 are adjacent, or power feed blocks 41 and 42 and GND blocks 43 and 44 are alternately arranged.

As illustrated in FIG. 10, the inductance of the configuration in FIG. 8 as represented by the line 201 is smaller than the inductance of the configuration in FIG. 9 as represented by the line 202. That is, when the power feed blocks 41 and 42 and the GND blocks 43 and 44 are alternately arranged, the production of a magnetic field is suppressed and the inductance is smaller, compared with when the power feed blocks 31 and 32 are adjacent and the GND blocks 33 and 34 are adjacent. Specifically, when currents flow next to each other in the same direction, the magnetic field is cancelled between the power feed blocks 31 and 32 as well as the GND blocks 33 and 34 but is increased on the periphery, and therefore the magnetic field as a whole is increased. By contrast, when adjacent currents flow in opposite directions, the magnetic field is increased between the power feed blocks 41 and 42 as well as the GND blocks 43 and 44 but is cancelled on the periphery, and therefore the magnetic field as a whole is reduced. In particular, the power supply structure 3 according to the present embodiment can suppress an increase in magnetic field since the gap between the power feed blocks 111 and 112 and the GND blocks 121 and 122 is minimized.

The inductance with a different shape of the power feed blocks 41 and 42 as well as the GND blocks 43 and 44 will now be described. Here, the description will be given by comparing the configuration in FIG. 8 with the configuration in FIG. 11.

In the configuration in FIG. 11, a power feed block 41 has a cylindrical shape with a height L32 of 7 mm and a conductor diameter of 8 mm. A power feed block 42 as well as the GND blocks 43 and 44 each have a cylindrical shape similar to the power feed block 41. A power supply pad 45 on the power supply board 2 is disposed to correspond to each of the power feed blocks 41 and 42 as well as the GND blocks 43 and 44. Similar power supply pads are disposed also on the load board 1. The power feed blocks 41 and 42 as well as the GND blocks 43 and 44 are fixed to the load board 1 with the screws 101 and fixed to the power supply board 2 with the screws 102. The power feed blocks 41 and 42 as well as the GND blocks 43 and 44 are disposed such that a distance L31 between the center axes is 12 mm, in the same manner as in FIG. 7. In other words, the power feed blocks 111 and 112 as well as the GND blocks 121 and 122 have a distance between conductors of 4 mm. That is, the configuration in FIG. 8 and the configuration in FIG. 11 differ in shape of the power feed blocks 111 and 112 as well as the GND blocks 121 and 122, namely, a quadratic prism or a cylinder.

As illustrated in FIG. 12, the inductance of the configuration in FIG. 8 as illustrated by the line 201, that is, the inductance of the configuration as an example of the present embodiment is smaller than the inductance of the configuration of FIG. 11 as illustrated by the line 203. That is, when the quadratic prism-shaped power feed blocks 111 and 112 and GND blocks 121 and 122 are used, the inductance is smaller than when the cylindrical power feed blocks 41 and 42 and GND blocks 43 and 44 are used. That is, the quadratic prism shape of the power feed blocks 111 and 112 as well as the GND blocks 121 and 122 can increase the adjacent area and thereby can reduce inductance. In this way, the result of simulation with the adjacent area changed also suggests that the larger adjacent area reduces the inductance. That is, the inductance in the case of the power feed blocks 111 and 112 as well as the GND blocks 121 and 122 can be approximated by Equation (3) representing the inductance of the parallel flat plates 301 and 302.

In this way, in the power supply structure 3 according to the present embodiment, the quadratic prism-shaped power feed blocks 111 and 112 and GND blocks 121 and 122 are alternately arranged to further reduce inductance and reduce power supply noise.

As described above, in the power supply structure according to the present embodiment, the bus block fixed in a state in which the power feed blocks and the GND blocks are arranged in a row is used for power supply from the power supply board to the load board. In this arrangement, the power feed block and the GND block are not adjacent, so that the directions of currents flowing through the adjacent paths are opposite. Thus, the magnetic fields produced by current can be cancelled out to reduce inductance and reduce power supply noise.

When the power feed block and the GND block shaped in a quadratic prism are compared with those shaped in a cylinder with the same power feeding distance, the quadratic prism shape can increase the adjacent area and can reduce inductance to reduce power supply noise. Even when large current is supplied, the quadratic prism shape can increase contact resistance, compared with a cylindrical shape, and thus can reduce the effects of voltage drop and heat generation. The prism shape is not limited to the quadratic prism as illustrated in the drawings and may be modified as appropriate as long as the prism shape can increase the adjacent area.

In addition, the integrated structure including the power feed blocks and the GND blocks put together with an insulator can avoid short-circuiting between adjacent blocks due to displacement.

When a bus bar is used as in a conventional example, the bus bar may be disposed at an end portion of the board, and this arrangement increases the length of the power supply path to the electronic component. When the bus bar is arranged inside the board, it is difficult to populate the board densely with electronic components, because a large area is allocated for fixing the bar with screws. By contrast, when the bus block according to the present embodiment is used, the block can be arranged in a narrow space inside the board, because the block is fixed on the top and the bottom with screws. This arrangement enables power supply through a shorter power supply path to the densely populated electronic components, thereby reducing heat generation in power supply to the densely populated electronic components, and reducing a voltage drop.

Figure 13:
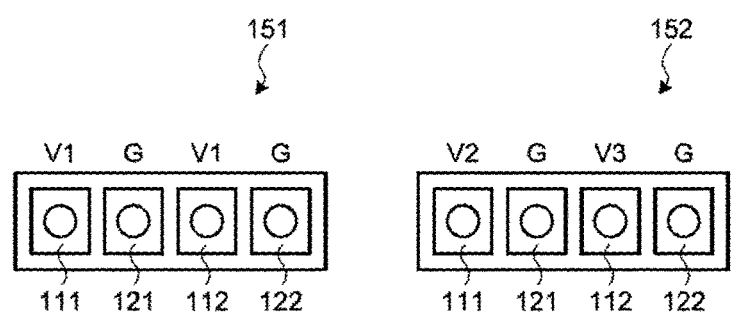
FIG. 13 is a diagram for explaining a power supply destination of the bus block according to an embodiment.

Here, the power source types for the power feed block 111 and the power feed block 112 may be the same or may be different. FIG. 13 is a diagram for explaining a power supply destination of the bus block according to the embodiment. In FIG. 13, V1, V2, and V3 denote different voltages. In FIG. 13, G denotes the GND block. For example, as in a bus block 151 in FIG. 13, the power feed blocks 111 and 112 may supply the same voltage V1. Alternatively, as in a bus block 152, the power source types may be different in such a manner that the voltage supplied by the power feed block 111 is V2 and the voltage supplied by the power feed block 112 is V3. Thus, the electronic component 10, which is a power supply destination of the power feed block 111 and the power feed block 112, may be the same component or may be different components.

Modification

In the present embodiment, the power feed blocks and the GND blocks are alternately arranged in series. However, they are not necessarily arranged in series because the magnetic field can be cancelled out if the power feed blocks and the GND blocks are alternately arranged.

Figure 14:
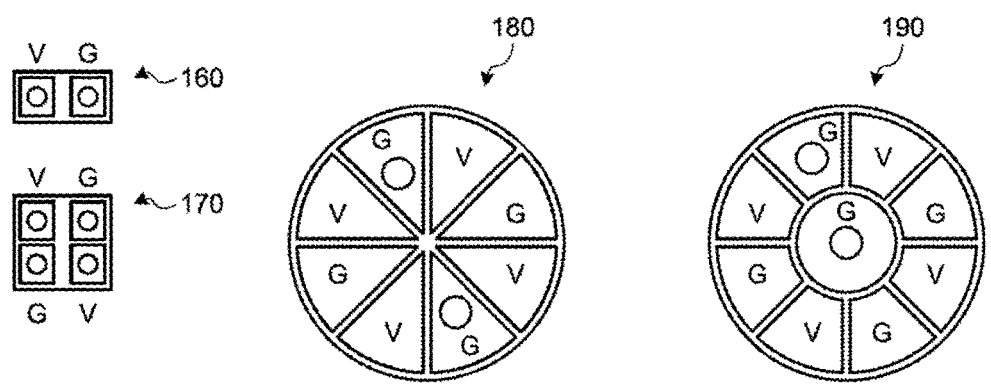
FIG. 14 is a diagram depicting an arrangement example of GND blocks and power feed blocks.

FIG. 14 is a diagram illustrating another arrangement example of the power feed blocks and the GND blocks. In FIG. 13, V denotes a power feed block, and G denotes a GND block.

For example, as in an arrangement 160, a power feed block and a GND block may be arranged side by side. Also in this case, the magnetic fields produced by current are cancelled out, thereby reducing inductance and reducing power supply noise.

Alternatively, for example, as in an arrangement 170, the power feed blocks and the GND blocks may be arranged in a checkerboard pattern. Also in this case, the magnetic fields produced by current are cancelled out, thereby reducing inductance and reducing power supply noise.

The block may be formed in any shape other than a quadratic prism that can increase the adjacent area. The adjacent area can be increased if the adjacent face is quadrangular. For example, as in an arrangement 180, blocks each shaped in a sector prism having a quadrangular side surface may be arranged into a ring. Also in this case, the magnetic fields produced by current are cancelled out thereby reducing inductance, and in addition, the larger adjacent area can reduce inductance and reduce power supply noise.

Alternatively, for example, as in an arrangement 190, a GND block may be arranged at the center of the arrangement 180. Also in this case, the magnetic fields produced by current are cancelled out, thereby reducing inductance and reducing power supply noise.

As long as the directions in which current flows are opposite between the adjacent block-shaped conductors, a power feed block and a GND block used for the same power source may be adjacent to each other, or a power feed block and a GND block used for different power sources may be adjacent to each other.

As described above, the configuration may be in a different arrangement as long as power feed blocks and GND blocks are alternately arranged. Also in such a case, inductance can be suppressed, and power supply noise can be reduced. Even when the block is not shaped in a quadratic prism, the adjacent face shaped in a quadrangle can reduce inductance and can reduce power supply noise.

An aspect of the power supply structure disclosed in the present application achieves the effect of reducing power supply noise at a time of large current supply to a board densely populated with electronic components.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A power supply structure comprising:
a first plate member that includes a load, and has first wiring connected to the load;
a second plate member that includes a power supply unit that supplies electric power to the load and has second wiring connected to the power supply unit; and
a block member that has prism-shaped conductive members arranged with a gap interposed therebetween and fixed, is held between the first plate member and the second plate member such that end faces of the conductive members are in contact with the first plate member and the second plate member, and consists of power feed blocks and GND blocks being arranged alternately, the power feed blocks being connected to the first wiring and the second wiring such that current flows from the second plate member to the first plate member, the GND blocks being connected to the first wiring and the second wiring such that current flows from the second plate member to the first plate member;
wherein in the block member, the conductive member through which current flows in the direction from the second plate member to the first plate member has one end face connected to an electrode on the second plate member connecting to the second wiring and has another end face connected to an electrode on the first plate member connecting to the first wiring connected to an input terminal of the load, and the conductive member through which current flows in the direction from the first plate member to the second plate member has one end face connected to an electrode on the first plate member connecting to the first wiring connected to an output terminal of the load and has another end face connected to a terminal on the second plate member connecting to the second wiring connected to ground.

2. The power supply structure according to claim 1, wherein the conductive members have a prism shape and the conductive members adjacent to each other are arranged such that respective side faces are opposed to each other.

3. The power supply structure according to claim 1, wherein the block member includes an insulator arranged in the gap.

4. The power supply structure according to claim 1, wherein the block member has two or more conductive members arranged in series.

* * * * *